United States Patent
Nagashima (10) Patent No.: US 7,293,998 B2
(45) Date of Patent: Nov. 13, 2007

(54) ELECTRONIC DEVICE AND CIRCUIT MODULE DEVICE

(75) Inventor: Koichi Nagashima, Kumagaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 10/993,141

(22) Filed: Nov. 22, 2004

(65) Prior Publication Data
US 2005/0118868 A1 Jun. 2, 2005

(30) Foreign Application Priority Data
Nov. 28, 2003 (JP) ............................. 2003-400912

(51) Int. Cl.
*H01R 12/00* (2006.01)
(52) U.S. Cl. ...................... 439/76.1; 439/607; 361/752
(58) Field of Classification Search ............... 439/76.1, 439/607, 92, 95; 361/752, 800, 818, 816, 361/797
See application file for complete search history.

(56) References Cited

U.S. PATENT DOCUMENTS

| | | | | |
|---|---|---|---|---|
| 6,411,522 B1 * | 6/2002 | Frank et al. | ................ | 361/800 |
| 6,442,027 B2 * | 8/2002 | Sanada et al. | ............... | 361/704 |
| 6,462,958 B2 * | 10/2002 | Ogata | .......................... | 361/800 |
| 6,538,903 B1 * | 3/2003 | Radu et al. | .................. | 361/818 |
| 6,663,437 B2 * | 12/2003 | Korsunsky et al. | ......... | 439/676 |
| 6,754,085 B2 * | 6/2004 | Kalkbrenner | ............... | 361/752 |

FOREIGN PATENT DOCUMENTS

| | | |
|---|---|---|
| CN | 1433257 | 7/2003 |
| JP | 8-148877 | 6/1996 |
| JP | 2003-309392 | 10/2003 |

* cited by examiner

*Primary Examiner*—Hien Vu
(74) *Attorney, Agent, or Firm*—Pillsbury Winthrop Shaw Pittman, LLP (57) ABSTRACT

The invention comprises a connector provided at a predetermined position on a circuit board on which a predetermined circuit pattern is formed and electronic parts are disposed at positions which corresponds to the circuit pattern, a body with four faces which covers the circuit board such that the connector can be exposed to the outside, first and second planes which shield the circuit board positioned in the body with four faces together with the body with four faces, and a shield structure which electrically separates the portion for connection of the connector and the circuit pattern and electronic parts which are disposed at a position corresponding with the circuit pattern.

3 Claims, 7 Drawing Sheets

ELECTRONIC DEVICE AND CIRCUIT MODULE DEVICE

CROSS-REFERENCE TO RELATED APPLICATIONS

This application is based upon and claims the benefit of priority from prior Japanese Patent Application No. 2003-400912, filed Nov. 28, 2003, the entire contents of which are incorporated herein by reference.

BACKGROUND OF THE INVENTION

1. Field of the Invention

This invention relates to a circuit board for processing signals input via, for example a connector or a connector terminal; a circuit module device in which the unnecessary radiation which sometimes superposes with input or output signals from the signal terminal provided on the circuit board can be reduced; and a typical electronic device such as video recording device or a video display device.

2. Description of the Related Art

As is well known, conventionally, in order to reduce unnecessary radiation generated from the circuit module, the entire circuit module is covered with a electromagnetic wave shield such as a shield cover and the like, and a connection structure is widely used in which a hole is formed at the portion where the circuit module connects with an external circuit, and connection is done using a connection cable or the like from the hole.

A connection structure is also widely used which connects by exposing the connecting parts such as the connector and the like at the external parts of the shield structure.

It is to be noted that a connecting structure which fixes a connector from the back face of a board onto a board installed at a predetermined position in a shield case, and which is used the connection of the electrode which penetrates the front face of the board with the exterior (example, Jpn. Pat. Appln. KOKAI Publication No. 8-148877) is proposed as an example in which it is possible to shield from electromagnetic waves at a predetermined level, while connecting with signal wires from the exterior.

However, in the connection structure disclosed in Jpn. Pat. Appln. KOKAI Publication No. 8-148877, the circuit portion of the circuit module is not completely shielded, and in order to shield the circuit portion, it is necessary to expose the connector portion at the exterior portion of the shield case, and this causes the problem of increased size of the board.

Furthermore, in this connection structure disclosed in Jpn. Pat. Appln. KOKAI Publication No. 8-148877, an opening portion is necessary for connection with the external circuit, and there is the problem that there is unnecessary electromagnetic wave leakage from this opening portion.

BRIEF SUMMARY OF THE INVENTION

According to one aspect of the present invention, there is provided a circuit module device comprising: a connector provided at a predetermined position on a circuit board on which a predetermined circuit pattern is formed and electronic parts are disposed at positions which correspond to the circuit pattern; a body with four faces which covers the circuit board such that the connector can be exposed to the outside; first and second planes which shield the circuit board positioned in the body with four faces together with the body with four faces; and a shield structure which electrically separates the portion for connection of the connector and the circuit pattern and the electronic parts which are disposed at a position corresponding with the circuit pattern.

According to another aspect of the present invention, there is provided an electronic device comprising: at least a connector provided at a predetermined position on a circuit board on which a predetermined circuit pattern is formed and electronic parts are disposed at positions which corresponds to the circuit pattern; a body with four faces which covers the circuit board such that the connector can be exposed to the outside; first and second planes which shield the circuit board positioned in the body with four faces together with the body with four faces; and a shield structure which electrically separates the portion for connection of the connector and the circuit pattern and the electronic part which is disposed at a position corresponding with the circuit pattern.

DETAILED DESCRIPTION OF THE INVENTION

Figure 1:
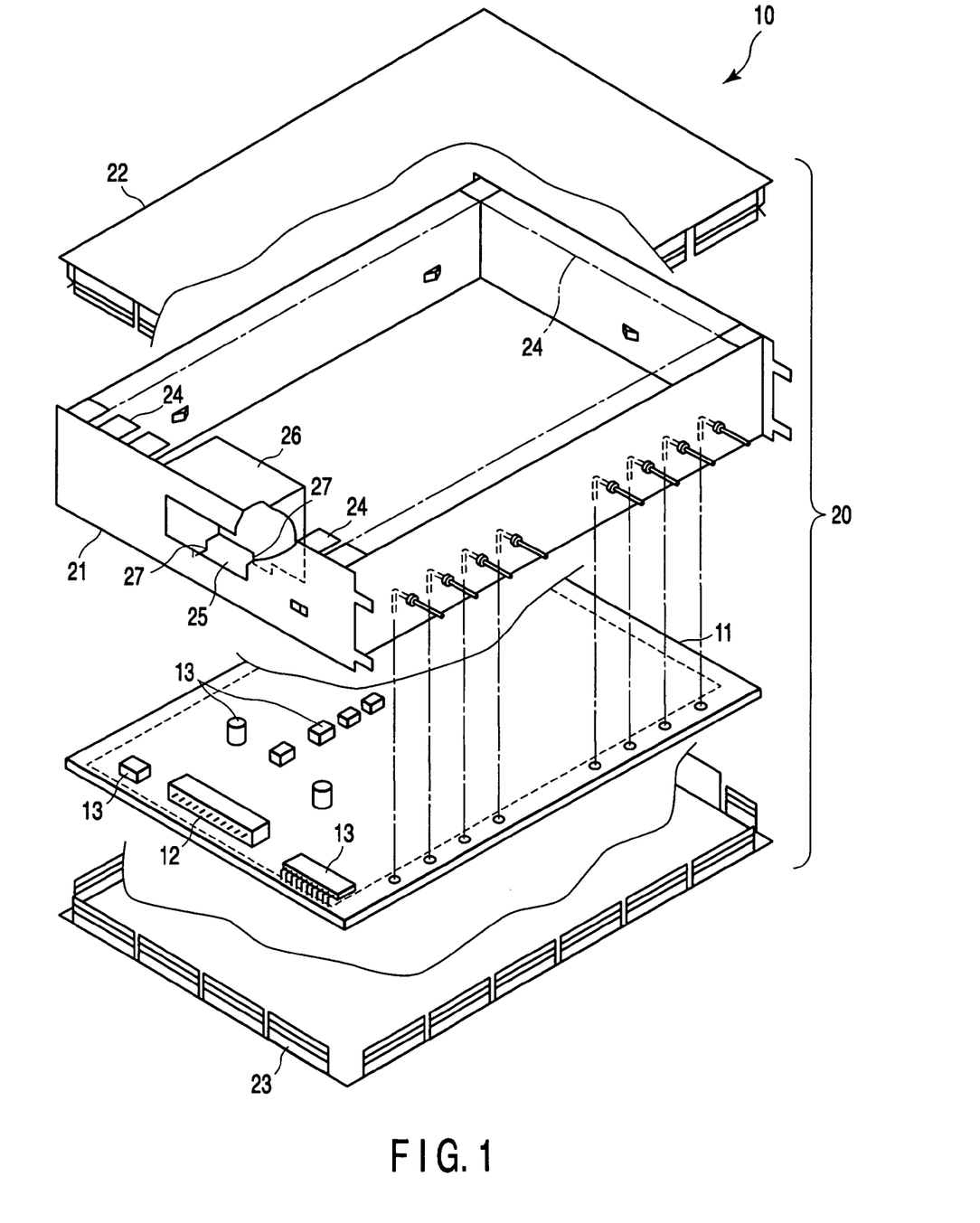
FIG. 1 shows an embodiment of this invention, and is an exploded perspective view showing the structure of the circuit module.

An embodiment of this invention is described in detail with reference to the drawings in the following. As shown in FIG. 1, the circuit module 10 which is incorporated into electronic devices such as a video recording device or video playing device, or a television receiver or computation device has a circuit module board (simply referred to as circuit board hereinafter) 11 which has circuit or circuit structure such as an LSI and the like which is capable of performing predetermined operations such as signal processing or computations, or encoding and decoding and the like.

A connector 12 used for connecting the circuit board 11 with an external circuit, and electronic parts (active device or passive devices) 13 used for predetermined operations of the circuit board 11 are disposed at predetermined positions on the circuit board 11 so as to match a circuit pattern which is not described in detail.

The circuit board 11 is covered by a shield case (simply referred to as shield hereinafter) 20 for preventing leakage of electromagnetic waves generated by the circuit board 11 to the outside, and to prevent electromagnetic waves or static electricity (outside noise) from the outside from reaching the circuit board 11.

The shield 20 is formed in a substantially rectangular shape, from a case 21 which is orthogonal to the plane direction of the circuit board 11, and substantially formed with four faces enclosing the four sides of circuit board 11, and a first (upper) plane portion 22 and a second (lower) plane portion 23 which contact the case 21 parallel to the plane direction of the circuit board 11 from the top and bottom of the case 21. It is to be noted that edge portions 24 are formed so as to extend from each of the four faces configuration of the case 21 at a predetermined length generally in parallel with the plane direction of the circuit board 11, and so as to be capable of contacting the upper plane portion 22 and the lower plane portion 23 respectively, and thereby improve the shielding effect.

An opening 25 for connecting the connector 12 that is positioned at a predetermined position on the circuit board 11, with an external circuit which is not shown (or with a wire such a flat cable and the like) or with an external device, is provided in a region where the connector 12 is exposed on a suitably selected side of the case 21.

The terminal of the opposite side (unexposed side) of the connector 12 which is exposed from the opening 25, that is, the inner side portion (board mounting portion) of the circuit board 11 of the connector 12 extends so that a part of the edge portion 24 of the case 21 is parallel to the circuit board 11, and the portion that is closer to the center of the plane direction of the circuit board 11 than the connector 12 is bent toward the circuit board 11 substantially at the cover position, and the connector shield 26 is thereby formed.

Figure 2:
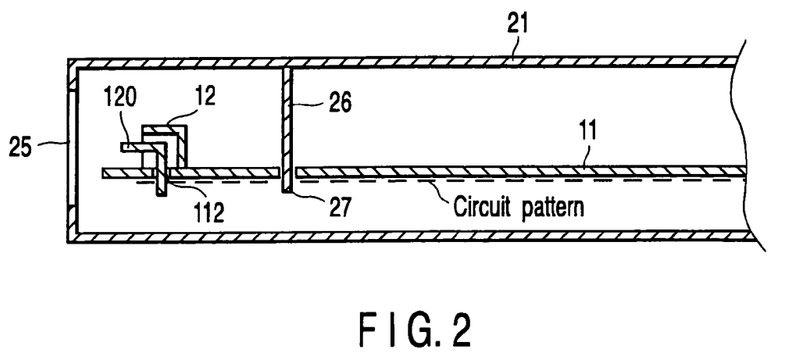
FIGS. 2 and 3 respectively show the expanded state of the case portion of the shield case used in the circuit module in the embodiment.

The connector shield 26 contacts (is fixed to) the circuit board 11 at the portion where the circuit pattern (shown by the dotted line in FIG. 2) on the circuit board 11 connects with the connector 12, that is, at a predetermined position which is closer to the center in the plane direction of the circuit board 11 than the connection region (connection position) where the terminal (contact) 120 of the connector 12 which is not described in detail, connects with the through hole 112 which is not described in detail, of the circuit board 11.

Figure 3:
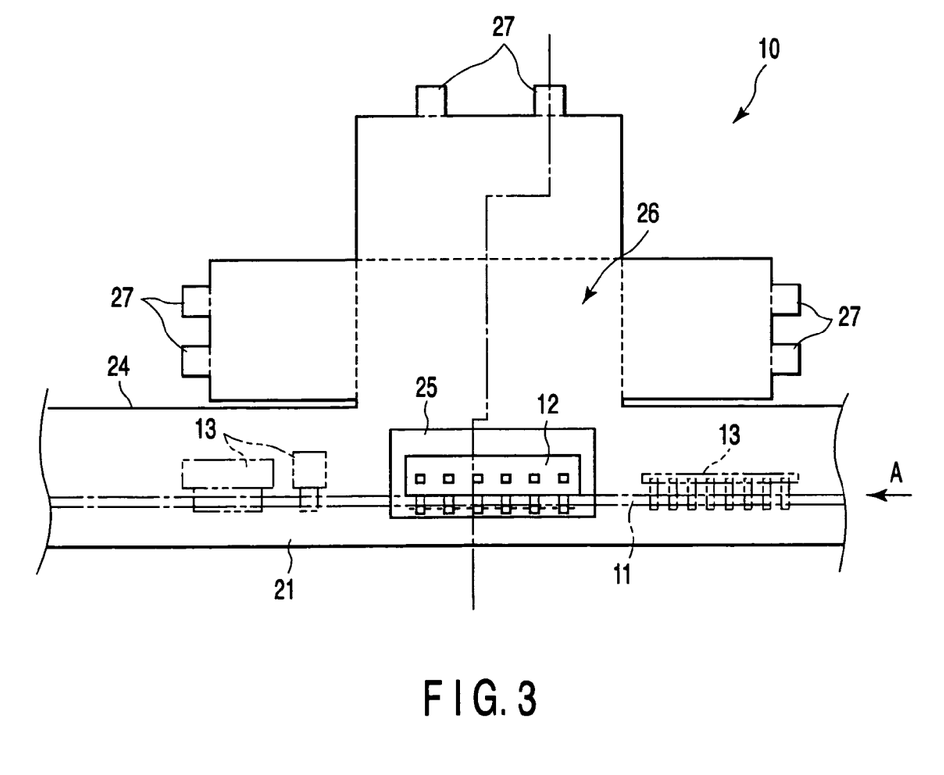

The front end of the connector shield 26 has a suitably selected number of ribs 27 formed at a portion of the connector shield 26 which extends and has a predetermined width. It is to be noted that the connector shield 26 and the ribs 27 are provided at four faces excluding the face at opening 25 side and face for connection or contact on the circuit board 11, assuming that the connector 12 is a rectangle. In addition, as shown in FIG. 3, the shield 26 and the ribs 27 are integrally formed with the case 21 and the edge 24 in a state in which the case 21 and the edge 24 of the case 21 are open. It is to be noted that the ribs 27 may be omitted.

The ribs 27 are fixed to the circuit board 11 by being inserted into rib receivers (openings formed as apertures or slits which correspond to the rib configuration) which is not described in detail and are formed in advanced on the circuit board 11. The ribs 27 are also fixed being soldered in a land region which is formed in advance at the same time as the wire pattern of the circuit board 11 in a state of being inserted therein.

That is, by forming the rib 27, the adverse effects caused by the shield 20 contacting the circuit board 11 or the connector 12 and the like are prevented. It is to be noted that when the land region is grounded, the entire shield 20 is also grounded and thus undesired radiation to the exterior of the electromagnetic waves generated by the electronic parts that are disposed on the circuit board 11 is prevented. Furthermore adverse effects on the circuit board 11 due to external noise caused by electromagnetic waves or static electricity from the exterior are reduced.

According to the above described circuit module 10, undesired radiation of electromagnetic waves from the circuit board 11 to the exterior is prevented. Also it becomes possible to dispose electronic parts in the space on the circuit board 11, which is near the connector shield 26, which covers the area around the connector 12, and thus the mounting density of the electronic parts is improved and the size (area) of the circuit module 10 is reduced.

It is to be noted that when the circuit module 10 in FIG. 1 is a tuner circuit which is included in video recording devices or video playing devices or television receivers the connector 12 may for example be an RF connector, a pin plug or a RCA connector. In the case where the circuit module 10 shown in FIG. 1 is for example, a personal computer or the like, the connector 12 may be a digital terminal which includes a parallel interface (RS232C and the like) or IEEE1394, or a USB interface.

Figure 4:
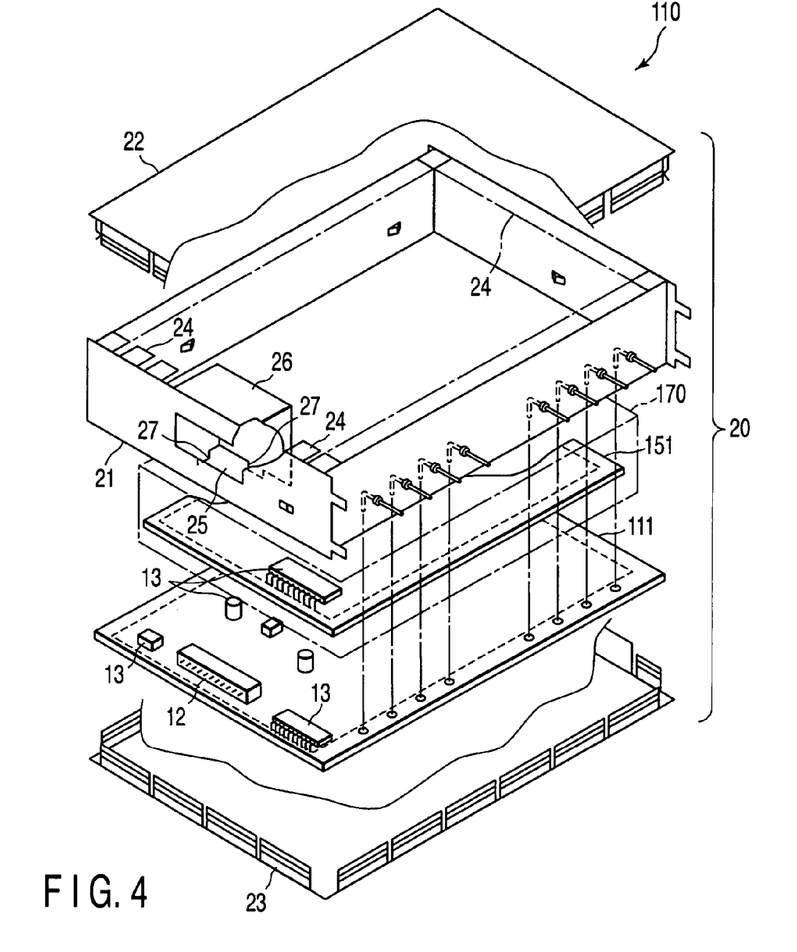
FIGS. 4 and 5 respectively show another structure of the circuit module of the embodiment.
Figure 5:
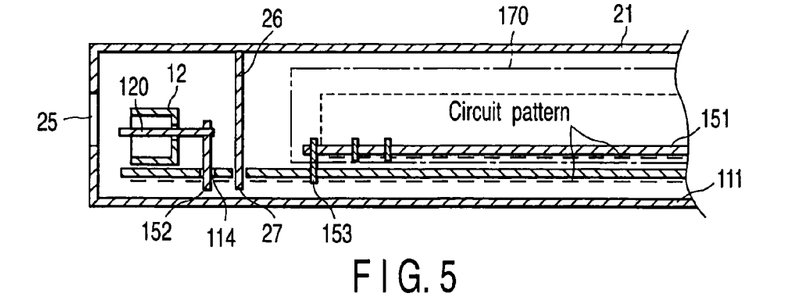

FIGS. 4 and 5 show another structure of the circuit module described using FIG. 1. It is to be noted that the elements shown in FIG. 1 which are substantially the same or similar have been assigned the same numbers and detailed descriptions thereof are not repeated.

As shown in FIGS. 4 and 5, the circuit module 110 has a first circuit module board (simply referred to as circuit board hereinafter) 111 which has a circuit or a circuit structure such as an LSI which is capable of performing predetermined operations and a second circuit module board (simply referred to a second circuit board hereinafter) 151 which is laminated at a suitably selected position on the circuit board 111.

The connector 12 and the electronic parts 13 and the like are arranged at predetermined positions on the circuit board 11 so as to match the circuit pattern. Connection patterns or ground patterns which are used for sending and receiving signals to the circuit board 111, and to and from the second circuit board 151 are also formed.

The circuit board 111 is covered by a shield case (simply referred to as shield hereinafter) 20. It is to be noted that the second circuit board 151 may also be independently shielded, for example, by a second shield case (simply referred to as second shield hereinafter) 170.

The shield 20 is substantially configured as a rectangle, from a case 21, and is substantially four face configuration enclosing the four sides of the circuit board 111, and a plane (upper plane) portion 22 and a second plane (lower plane) portion 23 which contact the case 21 in parallel with the plane direction at the top and bottom of the case 21. It is to be noted that and edge portion 24 is formed from each face formed with four faces of the case 21, and the edge portion 24 extends by a predetermined length, generally in parallel with the plane direction of the circuit board 11 such that the upper plane portion 22 and the lower plane portion 23 can contact each other, and the shielding effect is thereby increased.

An opening 25 for connecting the connector 12 that is positioned at a predetermined position on the circuit board 111, with an external circuit which is not shown (or with a wire such a flat cable and the like) or with an external device, is provided in a region where the connector 12 is exposed on a suitably selected side of the case 21.

The terminal of the opposite side (unexposed side) of the connector 12 which is exposed by the opening 25, that is, the inner side portion (board mounting portion) of the circuit board 111 of the connector 12 extends so that a part of the edge portion 24 of the case 21 is parallel to the circuit board 111, and the portion that is closer to the center of the plane direction of the circuit board 111 than the connector 12 is bent toward the circuit board 111 substantially at the cover position, and the connector shield 26 is thereby formed.

The front end of the connector shield 26 has a suitably selected number of ribs 27 formed at a portion of the connector shield 26 which extends and has a predetermined width. It is to be noted that the connector shield 26 and the ribs 27 are formed on four faces excluding the face at opening 25 side and the face for connection or contact on the circuit board 111 when the connector 12 is assumed to be a rectangle.

In addition, in the circuit module 110 which is shown in FIGS. 4 and 5, the contact 153 which is used for connecting the second circuit board 151 and the circuit board 111 is connected to a predetermined circuit pattern formed in advance in the back face of the base material of the second circuit board 151, the other terminal is connected by the contact 152 (with the circuit board 111) via the through hole (opening) 114 which is formed between the position connected to the contact 120 of the connector 12 fixed to the circuit board 111 and the fixing position where the connector shield 26 is fixed to the circuit board 111.

That is, as shown in FIG. 4, there is the possibility that the second circuit board 151 becomes a source of unnecessary radiation for the circuit board 111, and also in many cases, the second circuit board 151 needs to be shielded from external noise more than the circuit board 111, and thus the portion of connection of both boards are placed closer to the case 21 side than the connector shield 26 so that the possible unnecessary radiation generated at the portion of connection with the circuit board 111 does not affect the second circuit board 151.

It is to be noted that when there is a connection region in the circuit pattern (which is not described in detail) of the second circuit board 151 (shown by the dotted line in FIG. 5), it is necessary to securely ground the ground region of the second circuit board 151 via the circuit board 111 or the shield 20. As a result, even if the ground pattern is in a region other that the connection portion defined between the above-mentioned connector shield 26 and the circuit board 111, it must be securely connected.

As described above, according to the above-described circuit module 110, undesired radiation of electromagnetic waves from the circuit board 111 or the second circuit board 151 to the exterior is prevented. Furthermore, the unnecessary radiation generated at the circuit board 111 is prevented from reaching the second circuit board 151.

Figure 6:
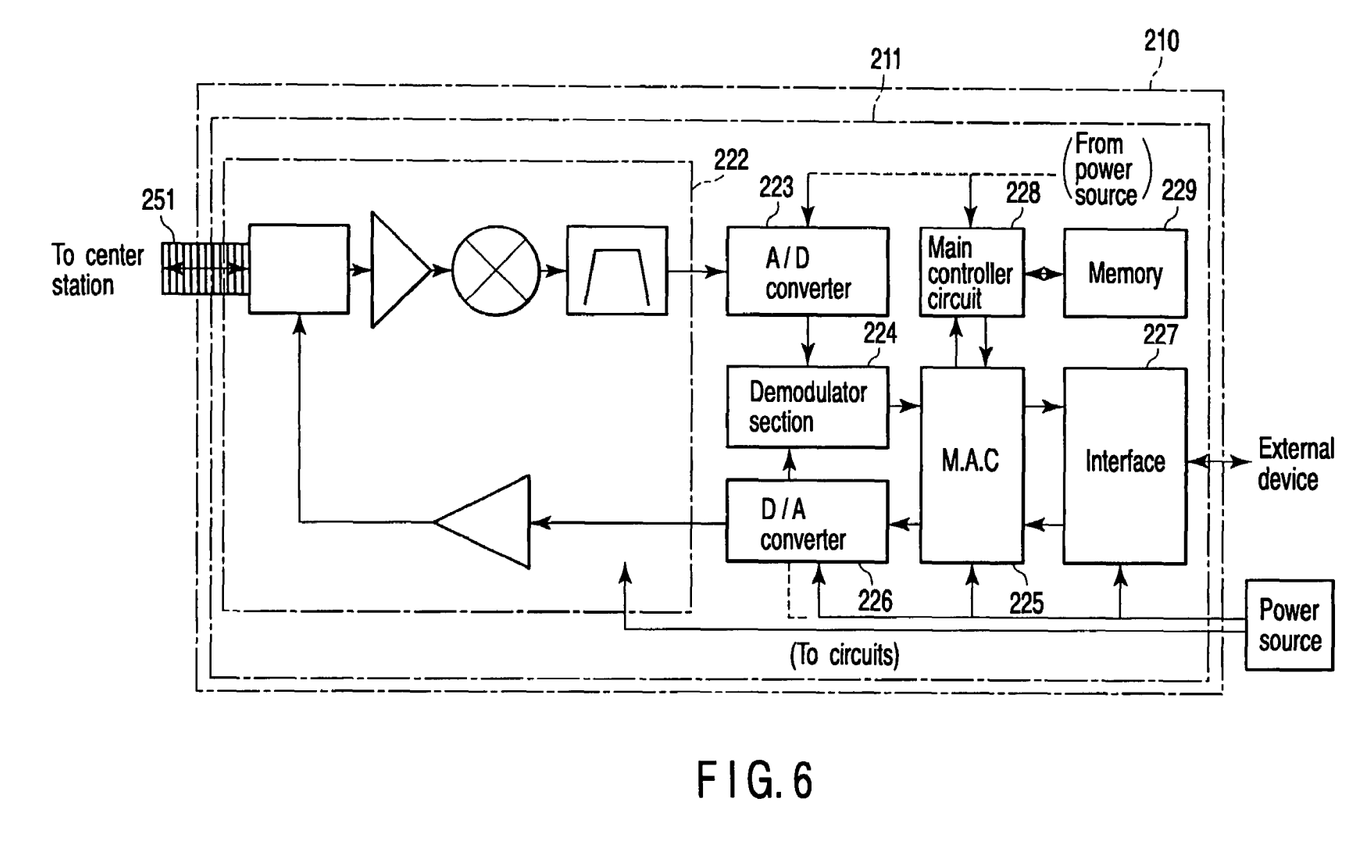
FIG. 6 is a block structural diagram showing an example of an electronic device including the circuit module of the embodiment.

FIG. 6 is a schematic block diagram showing the case in which a cable modem module is used an example of the electronic device including the circuit module shown using FIGS. 1 and 4.

The cable modem module (circuit module) 210 comprises an RF connector (coaxial connector) 251 to which an RF (coaxial) cable is connected which is used for sending and receiving signals to and from the center station (cable television (CATV) broadcast station); a circuit board 211 on which is disposed various circuits and function blocks which are described hereinafter; a tuner section 222 for processing high frequency signals input and output by the RF connector 251; an A/D converter 223 for converting the down signals (analog signals) which have been subjected to frequency conversion via the tuner section 222 to digital signals; a demodulator section 224 for demodulating the down signals which have been converted to digital signals via the A/D converter 223 and forming them into data; a MAC (Media Access Control) section 225 for generating up signals (digital signals); a D/A converter 226 for converting the up signals generated by the MAC section 225 to analog signals; an interface (connector) 227 which includes Ethernet specifications and the like for outputting down signals input to the MAC section 225 to external devices; a main controller (microcomputer) 228 for controlling the operation of each of the circuits and function blocks; and memory 229 and the like.

That is, by forming the circuit board 211 with a circuit module shielded by the shield described using the FIG. 1 or FIG. 4, undesired radiation of electromagnetic waves generated from the electronic parts disposed on the circuit board 211 of the module 210 from the connector (interface) 227 is prevented. Furthermore, the adverse effect on the circuit board 211 due to external noise caused by electromagnetic waves or static electricity from the exterior is reduced.

It is to be noted that, although a detailed descriptions thereof is not given, it is needless to say that in the cable modem module 210, for which an example is shown in FIG. 6, selection of receiving channels (programs) and sending and receiving of mail to and from the center station is possible through control signals from a remote terminal (remote controller) which is operated from a remote location and is not shown.

Also, although they are not shown, it is needless to say that a video output terminals which outputs video signals to brown tubes (television receiver) or a display device for example, and a audio terminals which outputs audio signals to a television monitor device a audio amplifying device (audio amplifier) may be included.

Figure 7:
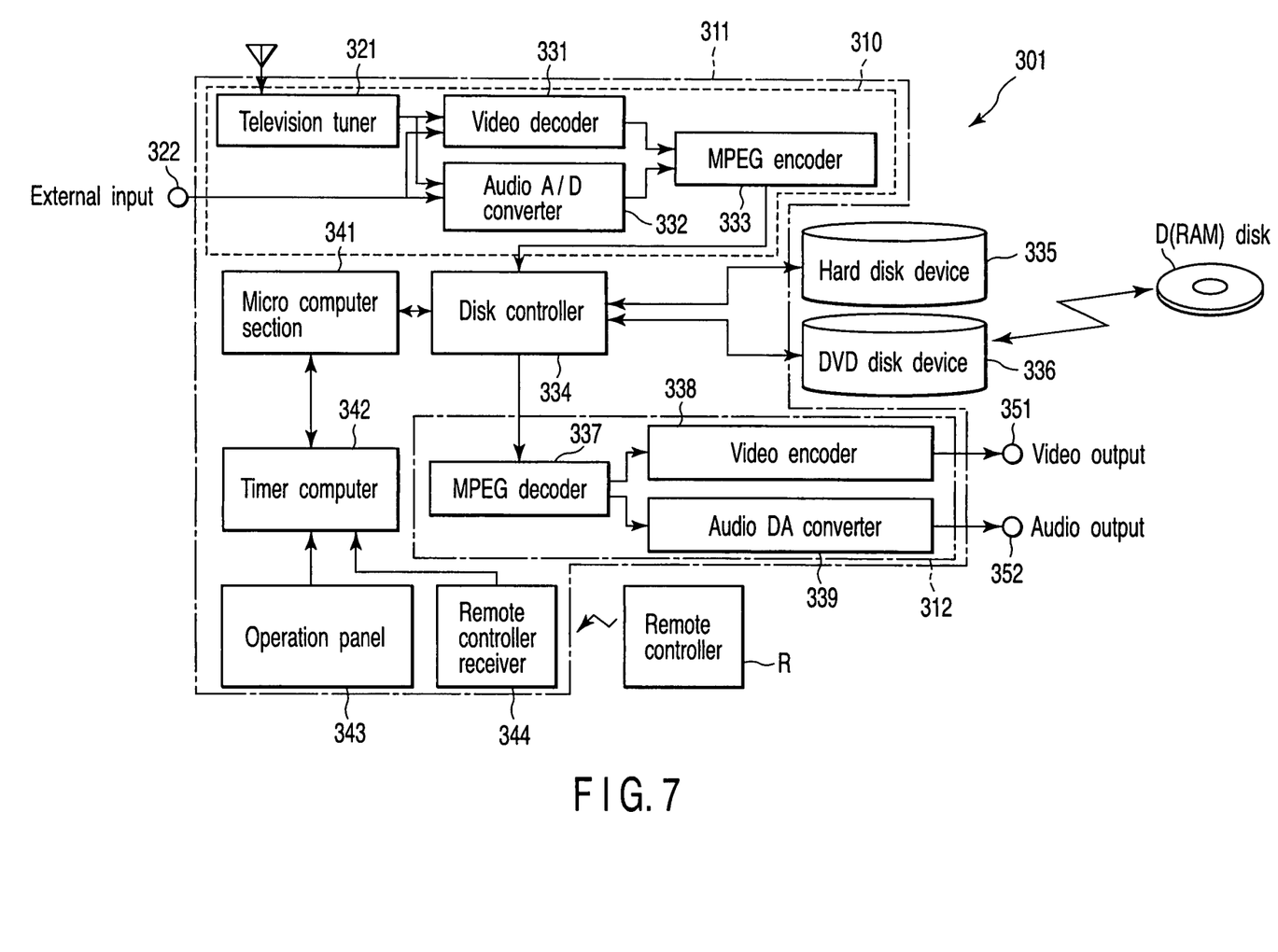
FIG. 7 is a block diagram showing another example of an electronic device including the circuit module of the embodiment.

FIG. 7 is a schematic block diagram showing the case where a video recording and playing device is used as an example of the electronic device including the circuit module shown using FIGS. 1 and 4.

In FIG. 7, the video recording and playing device (DVD recorder with hard disk) 301 has a television tuner 321 which selectively receives broadcast signals from predetermined channels and an external input terminal 322 which can input video signals and audio signals. The video signals and audio signal which are input from the exterior are input to the video decoder 331 and the audio A/D converter 332 respectively.

When video and audio are being recorded, the video signals and audio signals converted to digital signals by the video decoder 331 and the audio A/D converter 332 are encoded (compressed) to MPEG format data by the MPEG encoder 333.

The video signals and audio signals compressed (encoded) are stored on the hard disk drive (HDD) 335 via the disk controller 334.

Also, the video signals and audio signals compressed (encoded) are stored on a DVD-RAM disk (D) which is loaded beforehand in the DVD disk device 336 via the disk controller 334.

When the video and audio are played, the MPEG signals (compressed signals) that are input to the MPEG decoder 337 are read from the HDD 335 or the disk (D), and MPEG signals (compressed signals) input to the MPEG decoder 337 are decoded by the MPEG decoder 337, and converted to analog video signals and analog audio signals via the video encoder 338 and the audio D/A converter 339.

The analog video signals and audio signals from the video encoder 338 and the audio D/A converter 339 are output to the terminals of the video output 351 and the audio output 352 respectively.

That is, by connecting a television receiver which can play video or audio, or a video display device (monitor device) and an audio amplifier or the like to the terminals of the video output 351 and the audio output 352 respectively, video and audio output from the video recording and playing device 301 are played.

It is to be noted that circuits or units of each of the video decoder 331, the MPEG encoder 333, the disk controller 334, the MPEG decoder 337, the video encoder 338 and the like is controlled by a main controller which is the microcomputer 341.

A timer computer 342 is connected to the microcomputer 341.

Even when the main power source circuit (not shown) of the video recording and playing device 301 is in the OFF state, the timer computer 342 turns on the power source at a preset time, or at a predetermined time before the preset time, and each main component of the device 301 is on standby in a state in which recording is possible, before the starting time for the reserve recording.

As a result, when the time for reserve recording arrives, the broadcast (program) or video and audio on the channel for which recording is reserved, are recorded using the preset conditions.

It is to be noted that a main body operation panel (operation panel) 343 for inputting control signals for operation of the video recording and playing device 301 such as starting of recording, video playing, stopping (of recording and playing), skipping (during playing), time setting/inputting of reserve time, inputting reserve conditions, and turning the main power source on and off, is connected to the timer computer 342.

A remote control receiver 344 which receives various control signals input by the remote controller R is connected to the control panel 343, and control signals corresponding to the inputting of control signal from the remote controller R to the operation panel 343 can also be input at a position which is away from the main body of the device 301.

It is to be noted that the circuit module structure shown in FIG. 1 or FIG. 4 which is in the video recording and playing device (DVD recorder with hard disk) 301, is any one of, or a suitable combination of a suitably selected number of units or circuits, stored in a shield (not shown) as a single unit. Examples of the units or circuits include the television tuner 321, the external input 322, the video decoder 331, the audio A/D converter 332, MPEG encoder 333, the disk controller 334, the MPEG decoder 337, the video encoder 338, the audio D/A converter 339, the video output 351, the audio output 352, the microcomputer 341, the timer computer 342, or the remote control receiver 344 and the like. Also, a plurality of circuit modules may be provided in a main port which is not shown.

That is, as shown in the example of the dotted line (circuit module 310), the single dot broken line (circuit module 311) or the double dot broken line (circuit module 312), in the region where there is a circuit board including a specific circuit or unit as well as connecter types, by shielding the circuit module with a shield structure as shown in FIG. 1 or FIG. 4, undesired radiation of electromagnetic waves generated from the electronic parts used in suitably selected units or circuit boards to the outside is prevented. Furthermore, the adverse effect on the unit or circuit due to external noise caused by electromagnetic waves or static electricity from the exterior is reduced. It is to be noted that, for the television tuner 321 and the like on which external noise caused by electromagnetic waves or static electricity from the exterior tend to have an adverse effect, it is preferable that the double shield shown in FIG. 4 in particular is used.

Figure 8:
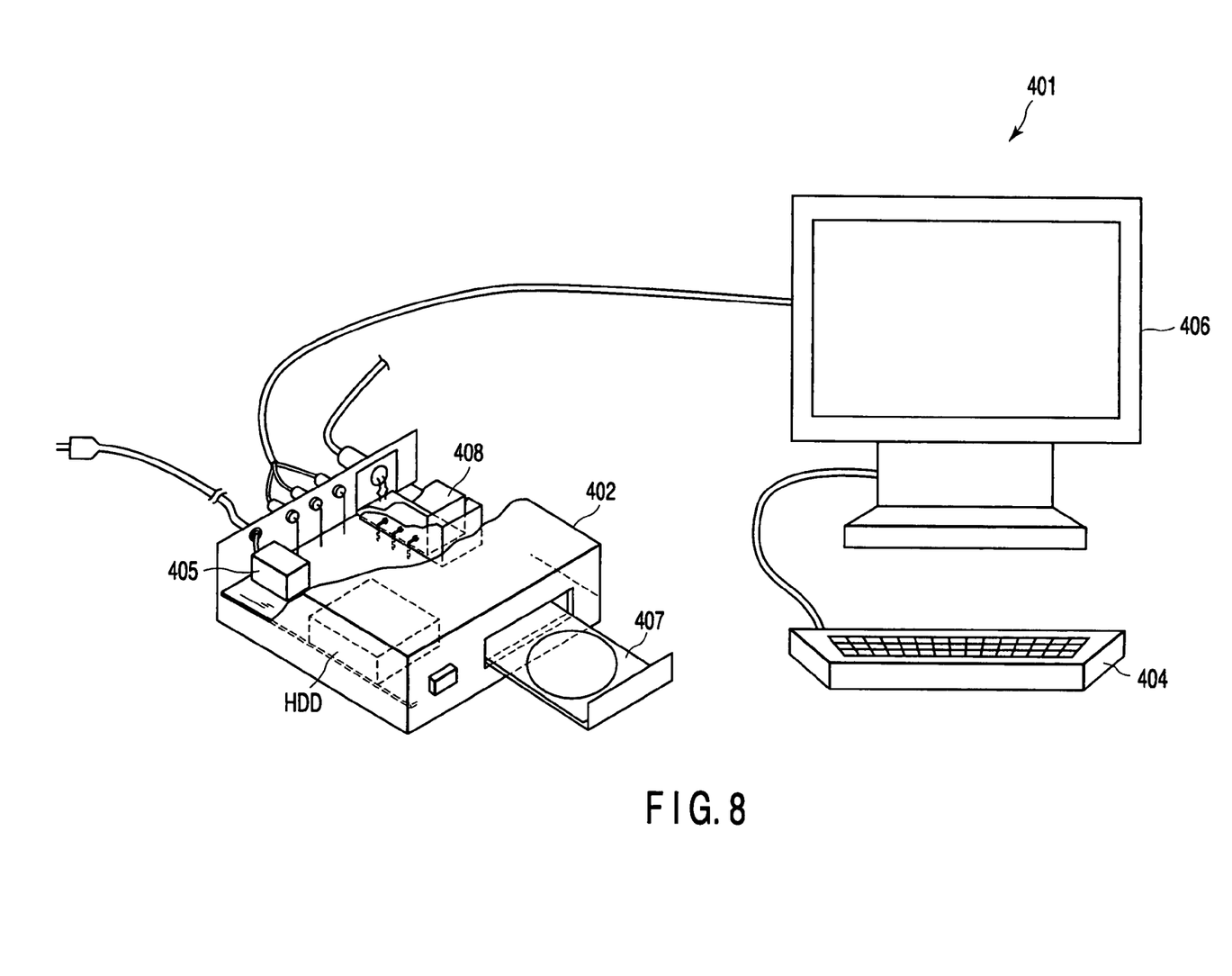
FIG. 8 shows an example of an electronic device which applies the circuit module in the embodiment.

FIG. 8 describes an example of a personal computer as the electronic device which includes the circuit module of FIGS. 1 and 4.

As shown in FIG. 8, the personal computer 401 is a known integrated system in which an external case 402, a main circuit board (mother board) which is not shown, a key board (input terminal) 404, a power source device 405 and a display device 406 are formed as a single unit.

The mother board comprises a disk drive 407 used for installing applications for example, a hard disk drive device (HDD) as the main storage device, a communications unit 408 which is used for communication with the outside and for transferring large data sets, and a television tuner (not shown) which is becoming a standard present day device, and the like.

It is to be noted that when the disk drive device 407 is a recording medium on which video or audio is recorded in the installed disk, the recorded audio and video may be played. The mother board is not described in detail but a unit or circuit board which includes a video board or a main body which is a typical audio playing device, and an input and output port and interface or the like used for connecting typical peripheral devices such as a printer and scanner.

As shown in FIG. 8, in the personal computer 401, the circuit module structure of FIG. 1 and FIG. 4 is widely used as one in which for example, a communication unit 408, a television tuner (not shown), a video board, units or circuits which are typical audio playing devices are integrally stored in the shield.

That is, by using a circuit module which is shielded by the shield structure shown in FIG. 1 or FIG. 4 as the circuit board included in a specific circuit or unit, undesired radiation to the outside of electromagnetic waves generated from the electronic parts used in the suitably selected unit or circuit is prevented. Furthermore, the adverse effect on the units or circuits due to external noise caused by electromagnetic waves or static electricity from the exterior is reduced. It is to be noted that for the communication unit 408 or the television tuner (not shown) and the like on which external noise caused by electromagnetic waves or static electricity from the exterior tend to have an adverse effect, it is preferable that the double shield shown in FIG. 4 in particular is used.

Figure 9:
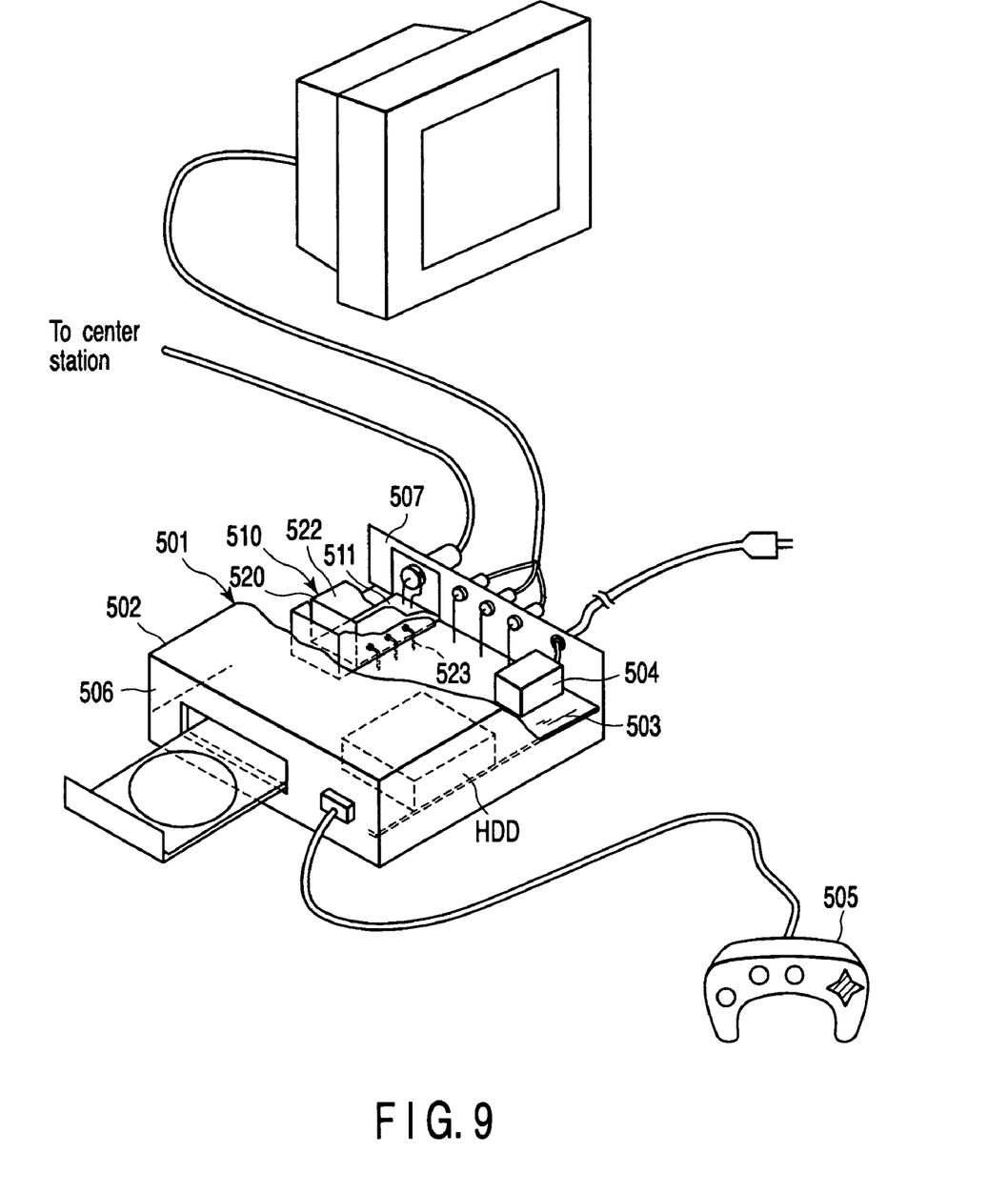
FIG. 9 shows another example of an electronic device which applies the circuit module in the embodiment.

FIG. 9 is an example of the case in which a game machine is used an example of the electronic device including the circuit module described using FIG. 1 and FIG. 4.

The game machine 501 shown in FIG. 9 comprises an external case 502, a main circuit board 503, a light source circuit board 504, a front panel 506 and a rear panel 507 and the like, and a cable modem unit 510 is provided at a predetermined position on the inside the game machine. It is to be noted that the front panel 506 is not described in detail, but it may be connected to the controller (input device) 505.

The game machine 501 shown in FIG. 9 also has a hard disk device (HDD) on which game software which is downloadable from the center station or version updating data or high score data can be stored or a communication unit and the like in which communication with a suitably selected competitor entered by the center station can be maintained or cut off.

It is to be noted that a disk drive device or card (cartridge) slot may be included so as to be integral, when the main portion of the game software is provided via a DVD specified disk medium or a particular specified storing medium (cartridge or card).

It is also to be noted that the main circuit board 503 is not described in detail, but it comprises a cable modem unit 510 at a predetermined position, including the circuit board 511 which is shielded in the same manner as that shown using FIG. 1 or FIG. 4.

Furthermore, because the cable modem unit 510 is shielded by the shield 520 and the upper cover (upper face) 522 and the lower cover (lower face) 523, input of unnecessary external radiation to the circuit board 511, and output of the unnecessary radiation from the circuit board 511 to the outside of the cable modem unit 510 is reduced.

As described above, in the electronic device and the circuit module of the present invention, the connector which is at a predetermined position on the circuit board, that is, at the portion where the circuit board and the connector connects, is shielded by a connector shield which is formed by one portion of the case of the shield case (four faces) which shields the area around the circuit board being bent.

Accordingly, the adverse effect on the circuit board due to external noise caused by electromagnetic waves or static electricity from the exterior can be reduced without increasing the number of parts or increasing the cost, and undesired radiation of electromagnetic waves from the circuit board to the exterior is prevented.

It is to be noted that because the connector shield is fixed to the circuit board by the ribs, undesirable results such as the shield coming in contact with the circuit board is prevented despite the simple structure in which a portion of the shield case is bent. In this case, by connecting the rib and the land (ground portion) of the circuit board, ground of the shield case can also be ensured.

In addition, it is also possible to dispose electronic parts in the space on the circuit board which is near the connector shield, and as a result, the mounting density of the electronic parts is improved and the size (area) of the circuit module 10 is reduced.

Thus, it becomes possible to send and receive high level signals and generation of undesired radiation (noise) to the exterior is prevented.

That is, according to the present invention, by covering the circuit module with an electromagnetic wave shield (shield case), unnecessary electromagnetic wave noise that is radiated from the circuit module can be emitted to the outside; the circuit module can be shielded from the unnecessary electromagnetic waves which are generated; the circuit module can be shielded from unnecessary electromagnetic waves noise from external circuits; and the shield case can be grounded at a stable ground potential.

It is to be noted that the present invention is not to be limited by the above-described embodiment and the various modifications may be made to the structural elements without departing from the scope of the invention. Furthermore, various inventions may be formed by suitably combining the plurality of elements disclosed in the above-described example. For example, some structural elements may be eliminated from the structural elements disclosed in the example. Also, structural elements from other examples may be suitably combined.

What is claimed is:

1. A circuit module device comprising:
   a connector provided at a predetermined position on a first circuit board on which a predetermined circuit pattern is formed and electronic parts are disposed at positions which corresponds to the circuit pattern;
   a shield case with four faces which covers the circuit board such that the connector can be exposed to the outside;
   first and second cover planes which contact the shield case of four faces to form a shield for the circuit board positioned in the shield case with four faces;
   a second circuit board provided at a predetermined position on the first circuit board which is covered by the shield case with four faces;
   a connector shield structure which electrically separates a connection portion of the connector and the circuit pattern and the electronic part which is disposed at a position corresponding with the circuit pattern, the connector shield structure being formed internally with the shield case with four faces and being bent to cover the connector; and
   a first connection member which electrically connects the circuit pattern formed in advance on the second circuit board and the predetermined pattern on first circuit board in a connection region that is provided between the connector shield structure and the connector;
   wherein the second circuit board has a ground region which is formed in advance, and a second connection member which connects the ground region and the first circuit board is connected with the first circuit board in the connection region provided between the predetermined circuit pattern of the first circuit board and the shield structure and the connector.

2. A circuit module device according to claim 1, wherein the connector shield structure is formed simultaneously with the body with four faces when the body with four faces is open.

3. A circuit module device according to claim 1, wherein the connector shield structure has at least one projection which is fixed at a predetermined position on the circuit board.

* * * * *